(12) United States Patent
Chen (10) Patent No.: US 7,232,758 B2
(45) Date of Patent: Jun. 19, 2007

(54) METHOD OF CORRECTING LITHOGRAPHIC PROCESS AND METHOD OF FORMING OVERLAY MARK

(75) Inventor: Tai-Yuan Chen, Changhua County (TW)

(73) Assignee: ProMOS Technologies Inc., Hsinchu (TW)

( * ) Notice: Subject to any disclaimer, the term of this patent is extended or adjusted under 35 U.S.C. 154(b) by 379 days.

(21) Appl. No.: 10/710,622

(22) Filed: Jul. 26, 2004

(65) Prior Publication Data
US 2005/0208683 A1    Sep. 22, 2005

(30) Foreign Application Priority Data
Mar. 17, 2004    (TW) .................................. 93107051

(51) Int. Cl.
*H01L 21/302* (2006.01)
(52) U.S. Cl. ..................................... 438/689
(58) Field of Classification Search ................ 438/478, 438/184, 193, 195–198, 200–207, 209–211, 438/218, 237, 165, 248, 168, 343, 294, 308, 438/6, 10, 107–114, 104, 118, 121–123, 128–129, 438/135, 142, 145, 149, 151, 157, 176
See application file for complete search history.

(56) References Cited

U.S. PATENT DOCUMENTS

| 2003/0064422 A1* | 4/2003 | McDevitt et al. .......... 435/7.32 |
| 2004/0058540 A1* | 3/2004 | Matsumoto et al. ........ 438/689 |
| 2004/0197939 A1* | 10/2004 | Clark .......................... 438/14 |

* cited by examiner

Primary Examiner—Michael Lebentritt
Assistant Examiner—Andre' Stevenson
(74) Attorney, Agent, or Firm—Jianq Chyun IP Office (57) ABSTRACT

A method of correcting a lithographic process is provided. A physical vapor deposition process (PVD) is performed to deposit a film on a wafer. The asymmetrical deposition of the film on the sidewalls of an opening is related to the change of target consumption in the PVD process. Therefore, the positional shift in an overlay mark may change each time. However, a formula relating target consumption with the degree of positional shift can be derived. The formula is recorded by a controller system. A compensation value can be obtained from the controller system and fed back in a subsequent lithographic process. Thereafter, a photoresist layer is formed on the film and a lithographic process is performed to pattern the photoresist. Since the compensation value can be fed back in the lithographic process via the controller system to correct for the positional shift in the overlay mark resulting from target consumption in the PVD process, errors in measuring the overlay mark can be reduced.

31 Claims, 6 Drawing Sheets

METHOD OF CORRECTING LITHOGRAPHIC PROCESS AND METHOD OF FORMING OVERLAY MARK

CROSS REFERENCE TO RELATED APPLICATIONS

This application claims the priority benefit of Taiwan application serial no. 93107051, filed Mar. 17, 2004.

BACKGROUND OF INVENTION

1. Field of the Invention

The present invention relates to a method of correcting processing errors and a method of forming overlay mark. More particularly, the present invention relates to a method of correcting lithographic process and a method of forming overlay mark capable of preventing errors in alignment measurement when the overlay mark is used for alignment in semiconductor fabrication.

2. Description of the Related Art

In general, aside from a proper control of the critical dimension, the yield of a wafer after a photolithograhic operation also depends on alignment accuracy. Therefore, the measurement of alignment accuracy or overlay error measurement in semiconductor fabrication is very important. An overlay mark is an auxiliary tool for measuring overlay errors. The overlay mark is a means of determining if a patterned photoresist layer produced after a photolithographic process is accurately aligned with a previous film pattern. Particularly, after an aluminum conductive line layer has been globally deposited over a wafer and the aluminum layer etched using a photoresist layer in the fabrication of metallic interconnect, the positions of alignment marks and overlay marks are often measured and compared. This ensures the aluminum lines are accurately aligned with the contact or plug. Furthermore, if there is any shifting in the alignment, the next photoresist layer for defining another aluminum line layer can be modified to compensate for the error.

Typically, the overlay mark is designed to dispose on the corner or peripheral region of chips on the wafer and are formed during the process of forming the metallic interconnects. Hence, if there is some error in the process of fabricating the metallic interconnects, relative positions of the overlay marks on the wafer will also be affected. In other words, the measured values of various overlay marks will differ.

As an example, aluminum lines are formed in a sputtering process. During the sputtering process, plasma production is closely related to the production of gaseous plasma ions (for example, argon ions). In other words, the probability of bombardment between high-energy electron and gaseous plasma atoms directly affects the sputtering process. To increase the probability of ionization of the gaseous plasma atoms (the so-called sputtering yield), the mean free path of the electrons within the plasma is preferably increased. At present, the most commonly used method for increasing the mean free path is to deploy an additional magnetron device. Typically, this means that a rotatable magnetron device is installed over a target within a plasma reaction chamber. Thus, through the magnetic field created by the magnetron device, charge particles within the reaction chamber are activated to follow a spiraling motion, thereby increasing the probability of collision. Because electrons are light particles, they have a very small radius of gyration and are mostly constrained to move within a short distance from the magnetic lines. In other words, electrons will mostly spiral near the magnetic field and increase the plasma ion density as well as ion bombardment frequency there.

Figure 1A:
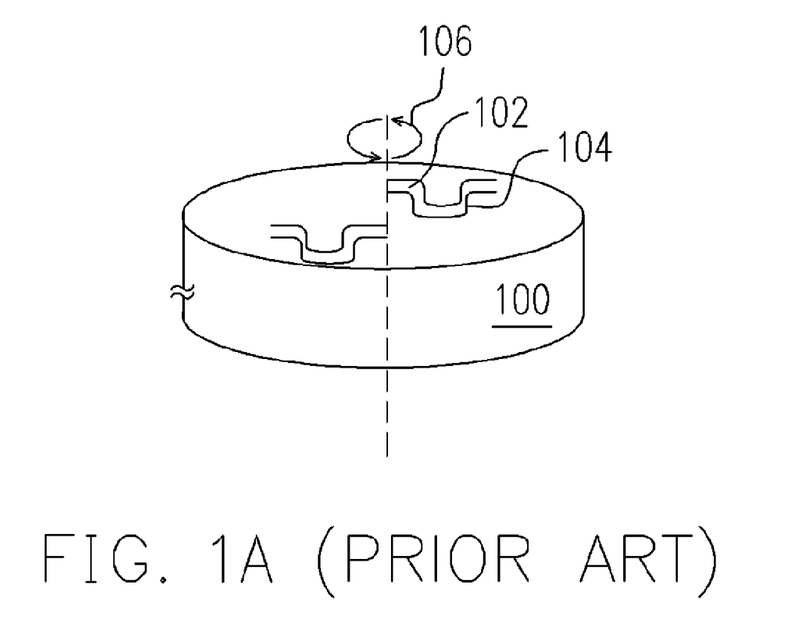
FIGS. 1A and 1B are diagrams showing a thin film on a opening section within a lithographic mark or overlay mark on a wafer using a conventional D.C. magnetron sputtering method.
Figure 1B:
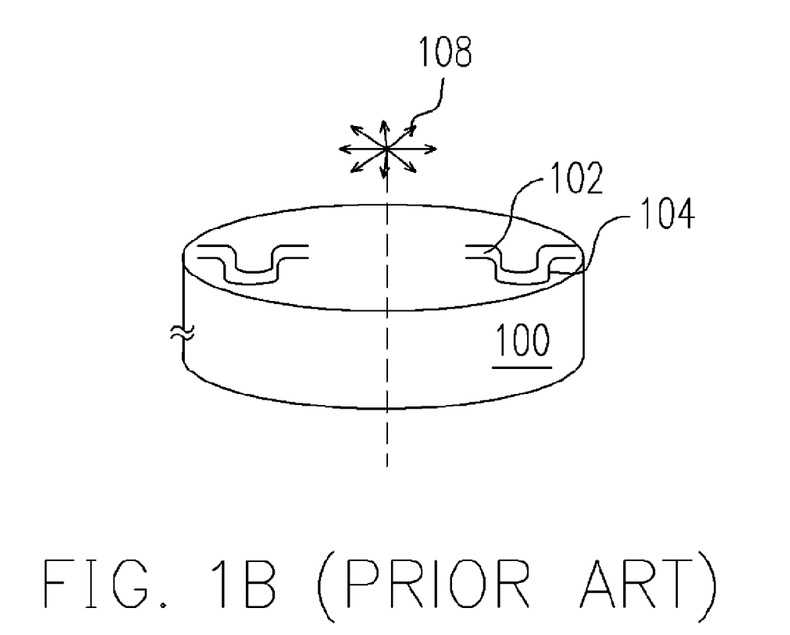

Because the magnet above the target rotates around a center, the bombarded surface of the target will develop concentric openings after a period of time. Since the target surface is no longer a flat surface, a portion of the sputtered metallic atoms may collide with the sidewalls of the openings and lead to a change in the sputtering rate between the central and peripheral portion of the target. When the sputtered atoms reach the recess hole or openings on the wafer, the sidewalls facing the central direction and the peripheral direction of the target will have different sputtered film thickness. Moreover, as the sputtering operation is continued, the amount of variation in the concentric opening will increase and the magnetic field strength at the sputtering location will intensify. Ultimately, asymmetric deposition of the sputtered film is amplified as shown in FIGS. 1A and 1B.

In the meantime, gaseous plasma ions subjected to the magnetic field from the magnetron device will bombard the target surface at a small biased angle so that quantity of sputtered metallic atoms in the reflecting direction is larger than in the other direction. The asymmetrical deposition caused by the magnetic lines parallel to the direction of rotation that activates the gaseous plasma ions to follow a direction perpendicular to the direction of rotation is neutralized by the rotation of the magnetron device. However, the magnetic lines perpendicular to the direction of rotation lead to an asymmetric deposition in a direction parallel to the direction of rotation. FIGS. 1A and 1B are diagrams showing a thin film on an opening section within a lithographic mark or overlay mark on a wafer using a conventional D.C. magnetron sputtering method. Due to the presence of concentric openings on the target and the effect of the magnetic lines on the sputtering angle of gaseous plasma ions relative to the bombarding target, the film 102 on the wafer 100 may be asymmetrically deposited on the sidewalls of the openings 104. Consequently, there will be a rotational shift (labeled 106) or radial shift (labeled 108) in the coordinates of the overlay mark.

In general, overlay mark measurement is based on the height difference on the surface of a wafer as measured by the difference in brightness at various interfaces. When a metallic film on the sidewall of an opening is asymmetrically deposited, the mid-point obtained by gauging the height difference of opening sidewalls may deviate from the true value. Furthermore, the degree of asymmetrical deposition will increase in proportional to the target consumption and hence the degree of shifting will increase with use. Although the shifting problem in lithographic process can be rectified through a few adjusting steps, this is not an efficient means because each depositing station and the circumstance around each shifting event are different.

SUMMARY OF INVENTION

Accordingly, The present invention is directed to a method of correcting a lithographic process capable of reducing the problem of an increase in asymmetrical deposition of a thin film with the degree of target consumption in a physical vapor deposition (PVD) process, and thereby reducing a change in the degree of shifting in a subsequently deposited metallic conductive lines relative to the overlay mark of a previous pattern.

The present invention is directed to a method of forming an overlay mark capable of reducing the problem of a shift in the overlay mark due to a thin film deposition using a conventional PVD process, and thereby reducing an error in measuring the overlay mark.

The present invention is directed to a method of correcting a lithographic process capable of reducing the problem of an increase in the degree of shifting in the overlay mark with processing frequency, and thereby reducing an error in measuring the overlay mark.

According to an embodiment of the present invention, a method of correcting a lithographic process provided. First, a physical vapor deposition process (PVD) is performed to deposit a film on a wafer. The deposited film leads to a shift in the overlay mark and the degree of shifting in the overlay mark is related to the target consumption in the PVD process. A formula relating the target consumption and the degree of shifting can be derived. The formula is stored inside a controller system. A compensation value can be obtained from the controller system through a computation based on the target consumption/overlay mark shifting formula. The compensation value can be fed back in a subsequent lithographic process. Thereafter, a photoresist layer is formed on the film and a lithographic process is performed to pattern the photoresist. During the lithographic process, the controller system feeds back the compensation value to correct the positional shift resulting from target consumption in the PVD process. In the aforementioned process of computing a compensation value, either a corresponding compensation value is obtained for each wafer or a corresponding compensation value is obtained for each batch having a specified number of wafers.

The present invention also directed to a method of forming an overlay mark. The method is suitable for forming the overlay mark over a wafer having a material layer thereon. First, an opening pattern is formed in the material layer to serve as an outer mark. Thereafter, a first film layer is formed over the material layer. A portion of the first film is removed to expose a portion of the material layer. A physical vapor deposition (PVD) process is carried out to form a second film layer over material layer covering the first film layer. The deposited second film layer has a certain degree of shifting according to the target consumption in the PVD process. A formula can be found within the degree of shifting with the target consumption. The formula is recorded by a controller system. Hence, the controller system is able to compute a compensation value and feeds the compensation value back in a subsequent lithographic process. Thereafter, a photoresist layer is formed on the second film layer and a lithographic process is performed to pattern the photoresist into an inner mark. During the lithographic process, the controller system feeds back the compensation value to correct for the positional shift resulting from target consumption in the PVD process. In the aforementioned process of computing a compensation value, either a corresponding compensation value is obtained for each wafer or a corresponding compensation value is obtained for each batch having a specified number of wafers.

The present invention is also directed to a method of correcting a lithographic process. First, a physical vapor deposition (PVD) process is carried out to form a thin film layer over a wafer. The deposited thin film will lead to a shift in the overlay mark on the film layer. The degree of shifting in the overlay mark is related to the target consumption in the PVD process. A formula can be found within the degree of shifting with the target consumption. Thereafter, a first compensation value is obtained through the formula. A photoresist layer is formed over the film layer. The first compensation value is combined with a set of data for correcting a lithographic process to produce a second compensation value. A lithographic process is performed to pattern the photoresist layer. During the lithographic process, the second compensation value is feed back to correct for the positional shift resulting from target consumption in the PVD process.

According to an embodiment of the present invention, a compensation value is fed back to correct the different amount of shifting in the overlay mark on a wafer due to physical vapor deposition or some other processes. Therefore, error in measuring the position of the overlay mark due to a shift in the overlay mark can be reduced. In other words, the problem of having a misalignment between a patterned film layer and a previous film layer can be reduced. Furthermore, the method of correcting a lithographic process through a formula that relates the target consumption in the PVD process with the degree of shifting in the overlay mark can be used together with other methods of correcting the lithographic process.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Reference will now be made in detail to the present preferred embodiments of the invention, examples of which are illustrated in the accompanying drawings. Wherever possible, the same reference numbers are used in the drawings and the description to refer to the same or like parts.

According to an embodiment of the present invention, a method of correcting a lithographic process and a method of forming an overlay mark is provided. A compensation value according to a relationship between the target consumption in a physical vapor deposition (PVD) process and degree of shifting in the overlay mark is computed and then fed back to correct the parameters used in a lithographic process. Hence, misalignment between the lithographic process and a previous film layer on the wafer due to an error in measuring the alignment of the overlay mark can be reduced. In the following, the steps for forming an overlay mark in the fabrication of metallic interconnect are illustrated as an example. However, the usefulness of the present invention is not limited to the fabrication of metallic interconnect. In addition, although the method of correcting a lithographic process is illustrated using a relationship between the degree of shifting and the target consumption in a physical vapor deposition (PVD) process, the present invention is not limited as such. The present invention can be applied to other processes that involve a definite relationship between the degree of shifting and the frequency of the processing operation.

Figure 2:
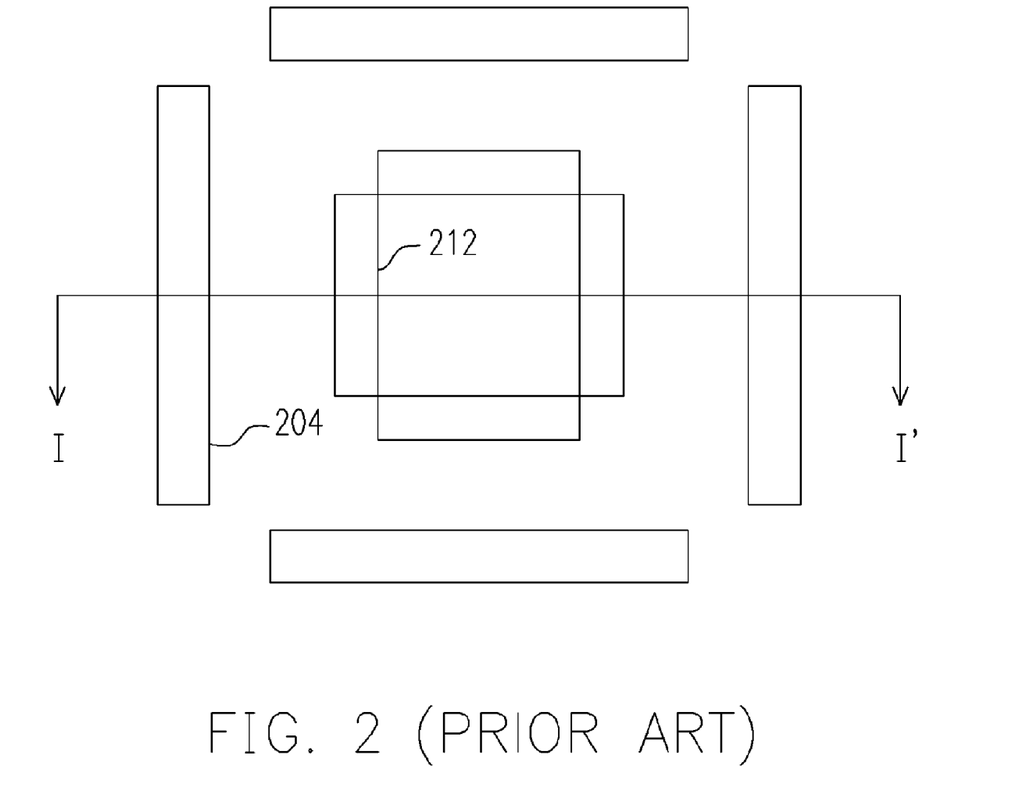
FIG. 2 is a top view of an overlay mark used in a conventional fabrication process of metallic interconnect.
Figure 3A:
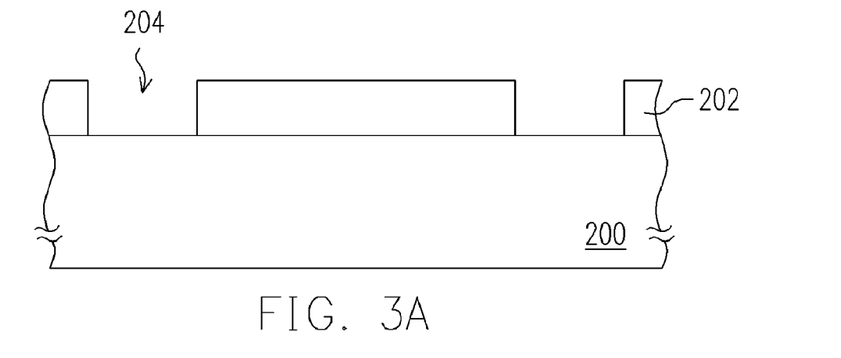
FIGS. 3A through 3F are schematic cross-sectional views showing the steps for fabricating an overlay mark according to one embodiment of the present invention.

FIG. 2 is a top view of an overlay mark used in the fabrication process of metallic interconnect. FIGS. 3A through 3F are schematic cross-sectional views showing the steps for fabricating an overlay mark according to one embodiment of the present invention. In fact, FIGS. 3A through 3F show a cross-section along line I-I" of FIG. 2. In the process of fabricating a metallic interconnect as shown in FIGS. 2 and 3A, a substrate 200 having a chip region and an overlay mark region is provided. A material layer 202 is deposited on the substrate 200. Thereafter, a photolithographic process and an etching process are carried out to pattern the material layer 202 so that a plurality of contact openings (not shown) is formed in the material layer 202 within the chip region. The material layer 202 is fabricated using an insulating material, for example. In the meantime, an opening pattern 204 is formed in the overlay mark region of the substrate 200 to serve as an outer mark. In one embodiment of the present invention, the outer mark of the overlay mark comprises four opening patterns 204 positioned to form a rectangular structure. Furthermore, the opening pattern 204 has a width much greater than the contact opening.

Figure 3B:
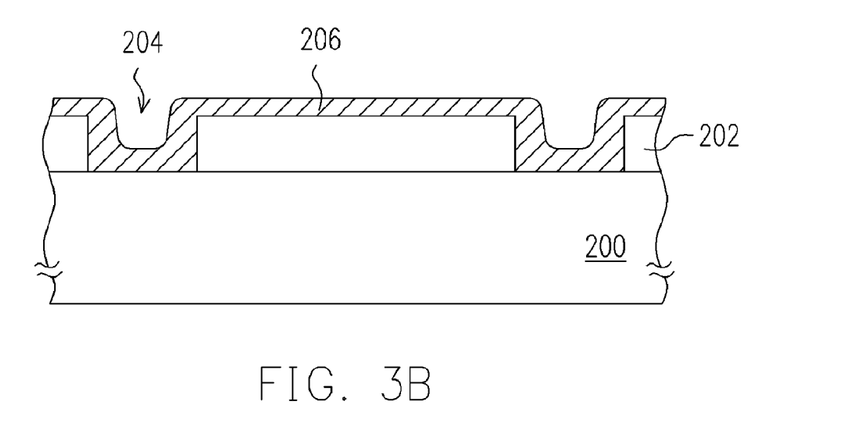

As shown in FIG. 3B, a metallic material is deposited to form a metallic layer 206 over the material layer 202. The metallic layer 206 fills the contact opening within the chip region and the opening 204 within the overlay mark region. Because the contact opening has a width much smaller than the opening 204, the metallic layer 206 fills the contact opening completely but only partially fills the opening 204.

Figure 3C:
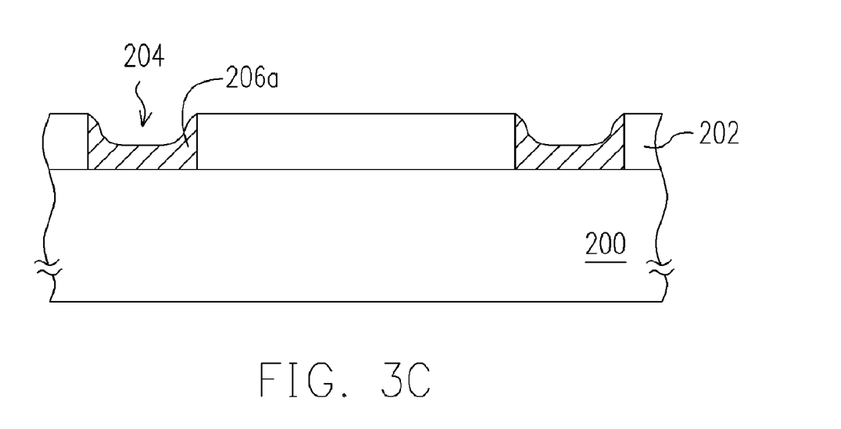

As shown in FIG. 3C, a portion of the metallic layer 206 is removed to expose a portion of the material layer 202. The metallic layer 206 can be removed, for example, by performing a chemical-mechanical polishing operation. The metallic layer 206 outside the contact opening within the chip region is removed to form a plug structure (not shown). At the same time, the metallic layer 206 outside the opening 204 within the overlay mark region is also removed to form a metallic layer 206a that only partially fills the opening 204.

Figure 3D:
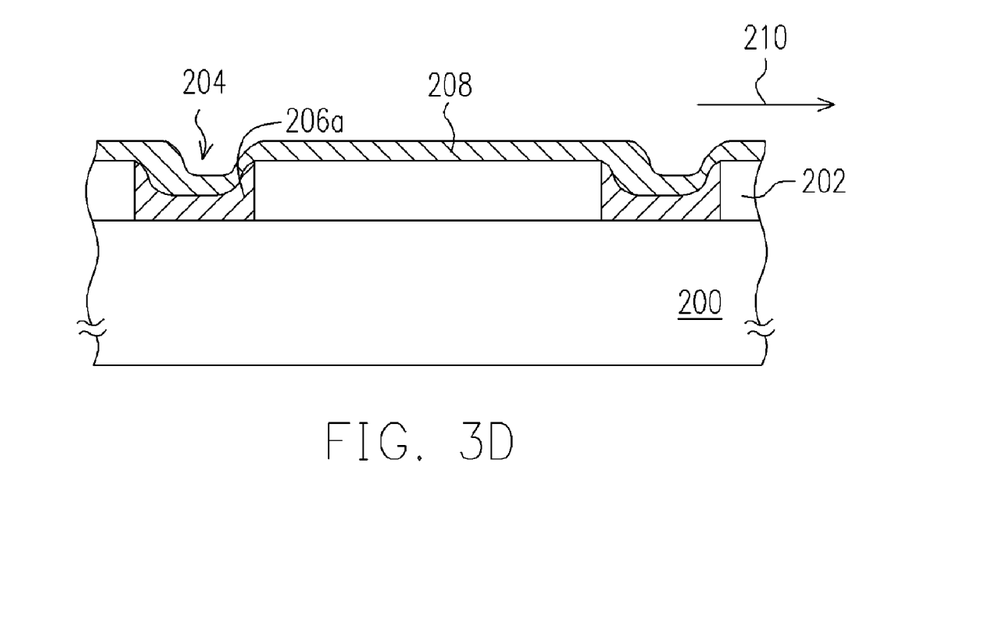

As shown in FIG. 3D, another metallic layer 208 is formed over the dielectric layer 202. Thereafter, the metallic layer 208 within the chip region is patterned to form a conductive line that connects with the contact plug. Within the overlay mark region, the metallic layer 208 on the outer mark area fills the opening 204 and covers the metallic layer 206a. Because the opening 204 has a sufficiently large width, the metallic layer 208 will not fill the opening 204 completely. Here, the metallic layer 208 is fabricated using a material selected from a group consisting of titanium, cobalt, nickel, tantalum, tungsten, aluminum and copper, for example.

It should be noted that the metallic layer 208 is formed in a DC magnetron sputtering process. After the target within the sputtering station has been used for some time, concentric openings are formed on the surface of the bombarded target and the angle of incident of the bombarding gaseous plasma ions is affected because of the effect produced by a rotating magnetic field. Therefore, the metallic layer 208 is asymmetrically deposited as shown in FIG. 3D. Ultimately, there is a shift in the overlay mark. Aside from a shift in a direction away from the center of the wafer as shown in FIG. 3D, the deposition may be a radial shift towards the center of the wafer or a rotational shift (106 in FIG. 1A). In addition, the rotational shift (106) can be a clockwise rotation or an anti-clockwise rotation, for example.

Figure 4:
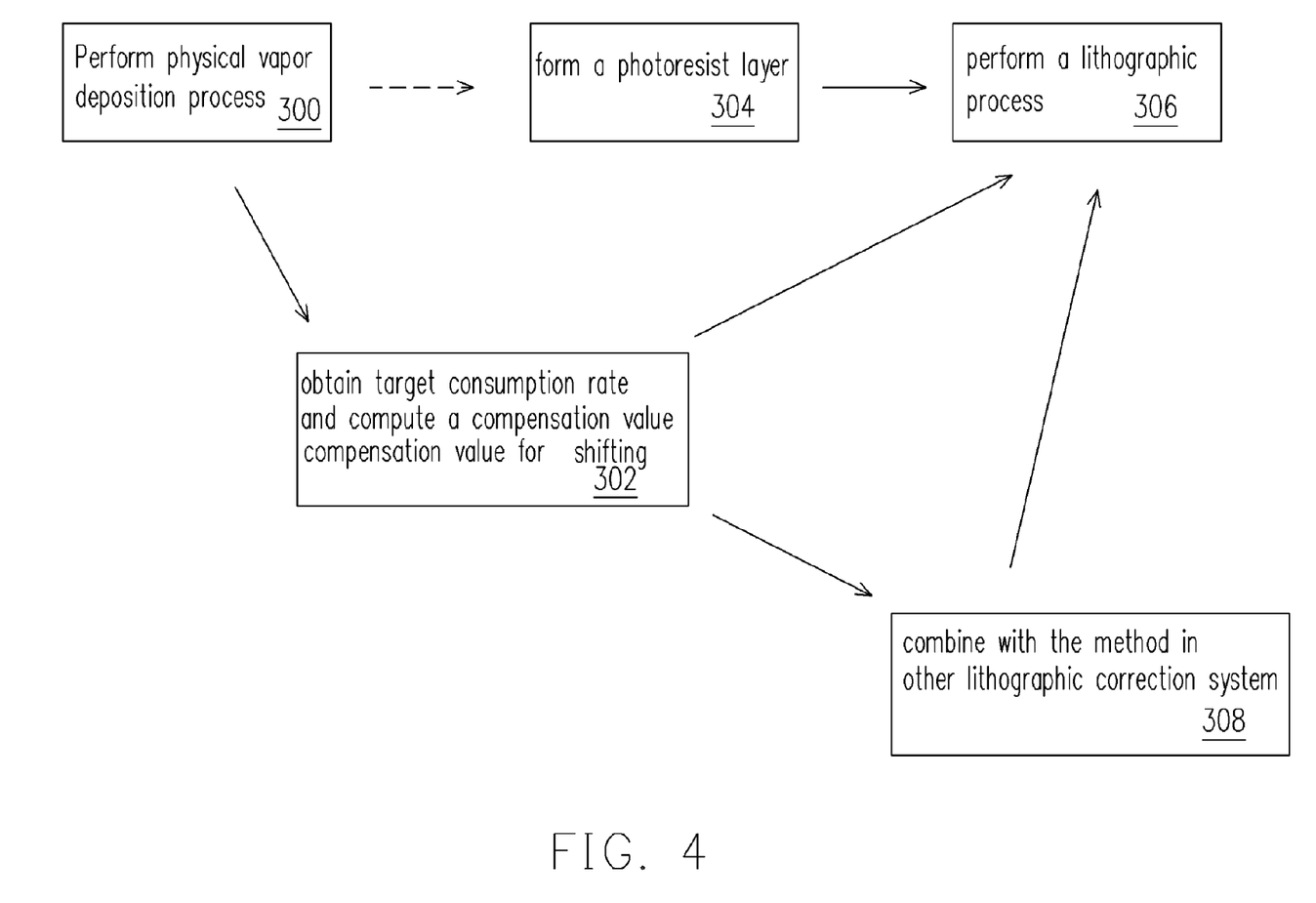
FIG. 4 is a flow diagram showing the steps for correcting a lithographic process according to one embodiment of the present invention.

To reduce subsequent errors in measuring the overlay mark due to an asymmetrical deposition of the metallic layer 208, a series of steps as shown in FIG. 4 aiming to correct the subsequently performed lithographic process is carried out first.

As shown in FIG. 4, after performing the physical vapor deposition (PVD) process (step 300), a photoresist layer is directly formed (step 304). In other embodiments, after performing the physical vapor deposition (PVD) process (step 300), an anti-reflection coating (ARC) or a hard mask is formed, and then a photoresist layer is formed on the anti-reflection coating (ARC) or the hard mask. Thereafter, a lithographic process is carried out (step 306) to form a patterned photoresist layer for patterning the metallic layer 208. Since the degree of shifting in the deposited film on the wafer depends on the target consumption in the PVD process (step 300), a formula can be found relating the two. In the present invention, a compensation value is obtained using the aforementioned formula after the PVD process (step 300). After forming the photoresist layer (step 304), the lithographic process (step 306) is carried out, taking into account the feedback compensation value.

The aforementioned formula is recorded within a control system. The control system computes a compensation value based on the target consumption and the formula and feeds back the value before carrying out the lithographic process. The control system is an advanced process control (APC) system, for example. In addition, the formula may be obtained by performing a statistical analysis between all the previously recorded target consumption of the PVD target and the corresponding shift. Moreover, there is no particular restriction on the unit for measuring target consumption. For example, the target consumption can be in kilowatt-hour. It should be noted that the control system might also record the target consumption of each PVD process and its corresponding shift (to obtain new data point) so that the target consumption versus shift formula can be renewed from time to time.

Figure 3E:
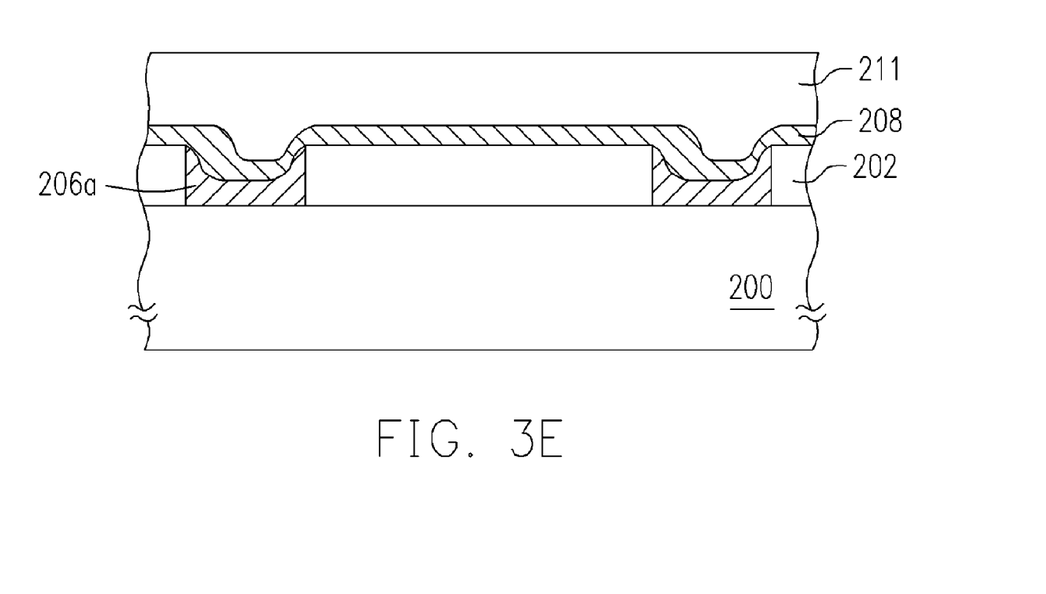

As shown in FIGS. 3E and 4, a photoresist layer 211 is formed over the metallic layer 208 (step 304). The photoresist layer 211 is formed, for example, by performing a spin coating and a thermal baking process.

Figure 3F:
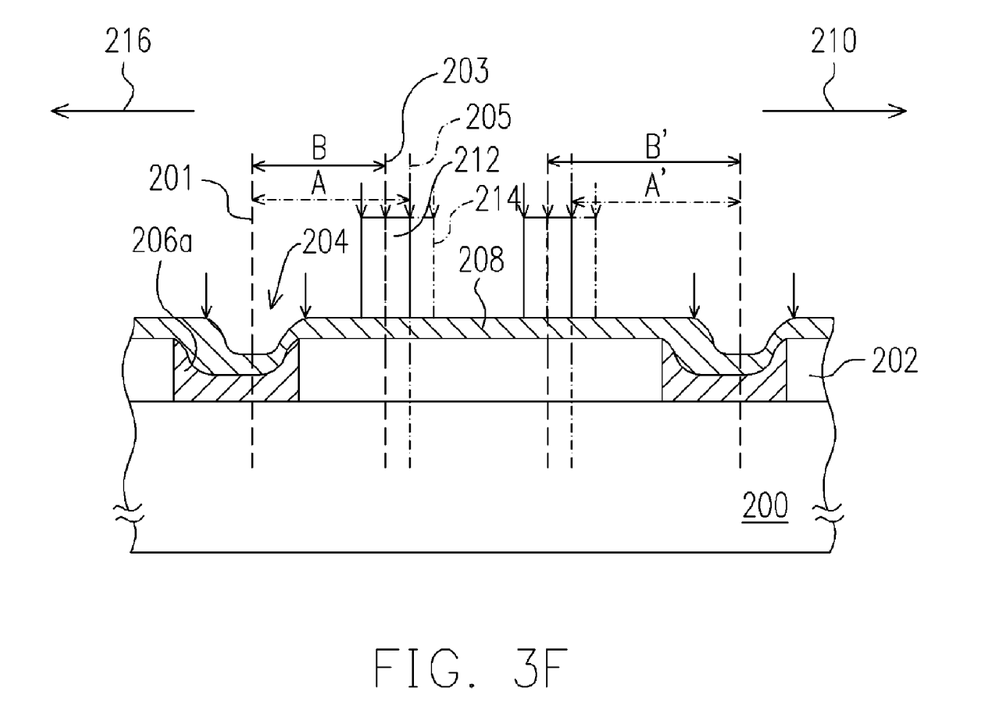

As shown in FIGS. 2, 3F and 4, a lithographic process of the photoresist layer 211 is carried out (step 306) to form a patterned photoresist layer over the metallic layer 208 within the chip region. In the meantime, an overlay mark pattern 212 is also formed on the metallic layer 208 within the overlay mark region to serve as an inner mark. During the lithographic process (step 306), the control system feeds back the previously computed compensation value to correct any error in the alignment and exposure step.

After the lithographic process, a measurement of the overlay mark is carried out. As shown in FIG. 3F, the dash line 201 located at the central point signal between two corner regions (arrow indicated) of the metallic layer 208 above the outer mark 204. Similarly, the dash line 203 located at the central point signal between two edge regions (arrow indicated) of the inner mark 212. The locations of the inner mark 214 and central point signal 205 for a lithographic process are carried out without feeding any compensation value are also displayed.

In the conventional technique, the signal 201 of the outer mark 204 and the signal 205 of the inner mark 214 are used to determine whether the inner mark is accurately aligned with the outer mark. Here, the outer mark represents the overlay mark of the previous pattern and the inner mark represents the current layer or the overlay mark on the metallic layer. In theory, the shift between the current layer and the previous pattern can be found by comparing the distance between the central point of the outer mark and the central point of the inner mark. However, the signal 204 is produced not from the central point, nor is there any compensating correction for the signal 205. Although the inner mark 214 and the outer mark 204 are aligned according to distances A and A', the lithographic process has already produced some shift. Hence, if the photoresist layer is subsequently used to define the metallic layer 208, the contact opening will not align accurately with the conductive line.

In the present invention, the inner mark/outer mark alignment and hence the alignment accuracy of the lithographic process in the present invention cannot be determined by the signal 201 of the inner mark 204 and the signal 203 of the outer mark 212 as in the conventional technique (for example, the value of B and B"). However, adjusting the position of the inner mark 212 directly through the compensation value to correct for any shifting produced after the PVD process, alignment accuracy of the lithographic process is reconstituted. For example, if the deposition shifts towards the direction 210, the compensation value adjusts the position of the inner mark 212 towards the direction 216. Therefore, aside from a change in the position of the inner mark 212 due to the feedback compensation value, the location of the patterned photoresist within the chip region will be adjusted correspondingly. In other words, the method of using a compensation value to correct for any positional shift after a PVD process is an effective means of resolving erroneous overlay mark measurement that results from a shift in the overlay mark position.

It should be noted that a compensation value could be obtained for each wafer in step 302. Obviously, it is equally feasible to obtain a compensation value for a batch of wafers with each batch comprising a definite number wafers. Furthermore, after a particular compensation value has been used for some time, the controller system may produce a new compensation value using the same target consumption/shifting formula. Alternatively, a new statistical analysis may be performed using the newly obtained target consumption/shifting data to produce a new formula before computing a new compensation value for a subsequent lithographic process.

In another embodiment of the present invention, after using the formula of PVD target consumption and the shift to obtain a first compensation value (step 302) for one particular shift value, the first compensation value and other data of a lithographic system may be combined together to produce another compensation value (a second compensation value) as shown in step 308 in FIG. 4. Thereafter, a lithographic process is carried out (step 306). The other lithographic system may include, for example, a station for exposing photoresist. Thus, before carrying out the lithographic process (step 306), a number of corrections aiming at one/batch of the lithographic processes can be carried out to improve overall accuracy.

In summary, major advantages of the present invention at least includes:

1. The present invention utilizes the feedback of a compensation value to correct the positional shift of overlay mark that results from a PVD or other process. Therefore, erroneous measurement of the overlay mark leading to the misalignment between the patterned film layer and the previous film layer is reduced. Furthermore, the method of using the relationship between PVD target consumption and the shift for correcting a lithographic process can be combined with any other correction methods.

2. In addition to providing a compensation value, the control system that hold the formula of the target consumption and the shift may record target consumption of each PVD process and its corresponding shift (fresh new data points can be collected in operation). Thus, the formula of the target consumption and the shift can be renewed from time to time.

3. When the method of the present invention is used to pattern metallic conductive lines, the conductive lines can be aligned more accurately. Furthermore, unlike the conventional method, there is no need to adjust the compensation value each time the alignment mark or the overlay mark is shifted. Hence, processing operation is simplified.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A method of correcting a lithographic process, comprising the steps of:
    performing a physical vapor deposition (PVD) process to form a thin film over a wafer, wherein an overlay mark on the wafer has a positional shift that depends on the target consumption in the PVD process and a formula relating the two can be derived;
    obtaining a compensation value from the formula;
    forming a photoresist layer over the thin film; and
    performing a lithographic process to pattern the photoresist layer, wherein the compensation value is fed back to correct parameters used in lithographic process.

2. The method of claim 1, wherein the step of obtaining the compensation value comprises obtaining a compensation value for each wafer.

3. The method of claim 1, wherein the step of obtaining the compensation value comprises obtaining a compensation value for each batch containing a specific number of wafers.

4. The method of claim 1, wherein the formula relating the target consumption and degree of shifting is recorded within a control system that also computes the compensation value and feeds the compensation value back to correct the lithographic operation.

5. The method of claim 4, wherein the control system further records the target consumption in each PVD process and corresponding shift in overlay mark position so that the formula can be renewed.

6. The method of claim 4, wherein the control system comprises an advanced process control (APC) system.

7. The method of claim 1, wherein the positional shift is in a direction towards a center of the wafer.

8. The method of claim 1, wherein the positional shift is in a direction away from a center of the wafer.

9. The method of claim 1, wherein the positional shift is a rotational shift.

10. A method of forming an overlay mark on a wafer having a material layer thereon, comprising the steps of:
    forming a opening pattern in the material layer to serve as an outer mark;
    forming a first film layer on the material layer;

removing a portion of the first film layer to expose a portion of the material layer;

performing a physical vapor deposition (PVD) process to form a second film layer over the first film layer, wherein the deposited second film layer causes a shift in an overlay mark such that the degree of shifting is related to the target consumption in the PVD process and a formula relating the two can be derived;

obtaining a compensation value from the formula;

forming a photoresist layer over the second film layer; and performing a lithographic process to form an inner mark, wherein the compensation value is fed back to correct parameters used in lithographic process.

11. The method of claim 10, wherein the step of obtaining the compensation value comprises obtaining a compensation value for each wafer.

12. The method of claim 10, wherein the step of obtaining the compensation value comprises obtaining a compensation value for each batch containing a specific number of wafers.

13. The method of claim 10, wherein the formula relating the target consumption and degree of shifting is recorded within a control system that also computes the compensation value and feeds the compensation value back to correct the lithographic operation.

14. The method of claim 13, wherein the control system further records the target consumption in each PVD process and corresponding shift in overlay mark position so that the formula can be renewed.

15. The method of claim 13, wherein the control system comprises an advanced process control (APC) system.

16. The method of claim 10, wherein the shift is in a direction towards a center of the wafer.

17. The method of claim 10, wherein the shift is in a direction away from a center of the wafer.

18. The method of claim 10, wherein the shift is a rotational shift.

19. The method of claim 10, wherein the material layer comprises an insulation material layer.

20. The method of claim 10, wherein the first film layer comprises a first metallic layer.

21. The method of claim 10, wherein the second film layer comprises a second metallic layer.

22. A method of correcting a lithographic process, comprising the steps of:

performing a physical vapor deposition (PVD) process to form a thin film over a wafer, wherein an overlay mark on the wafer has a positional shift that depends on the target consumption in the PVD process and a formula relating the two can be derived;

obtaining a compensation value from the formula;

forming a photoresist layer over the thin film;

combining the first compensation value with the data in a lithographic correction system to produce a second compensation value; and performing a lithographic process to pattern the photoresist layer, wherein the second compensation value is fed back to correct parameters used in lithographic process.

23. The method of claim 22, wherein the step of obtaining the first compensation value comprises obtaining a first compensation value for each wafer.

24. The method of claim 22, wherein the step of obtaining the first compensation value comprises obtaining a first compensation value for each batch containing a specific number of wafers.

25. The method of claim 22, wherein the formula relating the target consumption and degree of shifting is recorded within a control system that also computes the first compensation value and feeds the second compensation value back to correct the lithographic operation.

26. The method of claim 25, wherein the control system further records the target consumption in each PVD process and corresponding shift in overlay mark position so that the formula can be renewed.

27. The method of claim 25, wherein the control system comprises an advanced process control (APC) system.

28. The method of claim 22, wherein the positional shift is in a direction towards a center of the wafer.

29. The method of claim 22, wherein the positional shift is in a direction away from a center of the wafer.

30. The method of claim 22, wherein the positional shift is a rotational shift.

31. The method of claim 22, wherein the data in the lithographic correction system comprises the data obtained from a photo-exposure station.

* * * * *